(12) United States Patent
Yoo

(10) Patent No.: US 10,650,901 B2
(45) Date of Patent: May 12, 2020

(54) ELECTRONIC DEVICE, NON-TRANSITORY COMPUTER-READABLE STORAGE MEDIUM, AND METHOD OF CONTROLLING ELECTRONIC DEVICE

(71) Applicant: SK hynix Inc., Gyeonggi-do (KR)

(72) Inventor: Hee Nam Yoo, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 16/198,173

(22) Filed: Nov. 21, 2018

(65) Prior Publication Data

US 2019/0267099 A1    Aug. 29, 2019

(30) Foreign Application Priority Data

Feb. 26, 2018  (KR) .................. 10-2018-0022816

(51) Int. Cl.
  *G11C 16/26* (2006.01)
  *G11C 16/34* (2006.01)
  *G11C 11/56* (2006.01)

(52) U.S. Cl.
  CPC ............ *G11C 16/26* (2013.01); *G11C 16/349* (2013.01); *G11C 11/5642* (2013.01)

(58) Field of Classification Search
  CPC .............................. G11C 16/26; G11C 16/349
  USPC ........................................ 365/185.2, 185.11
  See application file for complete search history.

(56) References Cited

U.S. PATENT DOCUMENTS

| | | | |
|---|---|---|---|
| 2017/0140802 A1* | 5/2017 | Jeon | G11C 7/12 |
| 2017/0148510 A1* | 5/2017 | Bazarsky | G06F 11/1048 |
| 2019/0042356 A1* | 2/2019 | Chen | G06F 11/1012 |

FOREIGN PATENT DOCUMENTS

KR    1020150020478    2/2015

* cited by examiner

*Primary Examiner* — Han Yang
(74) *Attorney, Agent, or Firm* — IP & T Group LLP

(57) ABSTRACT

An electronic device includes a controller, a non-transitory computer-readable storage medium including memory cells having a plurality of threshold voltage distributions and storing operation codes executable by the controller. Based on the operation codes, controller is configured to: calculate average threshold voltages of the plurality of threshold voltage distributions and set a temporary read voltage corresponding to average threshold voltages of adjacent threshold voltage distributions among the plurality of threshold voltage distributions; generate a reference value by reading read values of the memory cells with the temporary read voltage and decide a standard value corresponding to the temporary read voltage; calculate an error rate based on the reference value and the standard value and set an offset value by reflecting the error rate in a difference between the average threshold voltages of the adjacent threshold voltage distributions; and set a read voltage by applying the offset value to the temporary read voltage.

20 Claims, 8 Drawing Sheets

ELECTRONIC DEVICE, NON-TRANSITORY COMPUTER-READABLE STORAGE MEDIUM, AND METHOD OF CONTROLLING ELECTRONIC DEVICE

CROSS-REFERENCES TO RELATED APPLICATION

The present application claims priority under 35 U.S.C. § 119(a) to Korean application number 10-2018-0022816, filed on Feb. 26, 2018, which is incorporated herein by reference in its entirety.

BACKGROUND

1. Technical Field

Various embodiments generally relate to an electronic device, and, more particularly, to an electronic device including a non-transitory computer-readable storage medium.

2. Related Art

An electronic device is an electronic system capable of processing data and may include a memory system. The memory system may store data under the control of an external device. The memory system may include a personal computer memory card international association (PCMCIA) card, a compact flash (CF) card, a smart media card, a memory stick, various multimedia cards (MMC, eMMC, RS-MMC, and MMC-micro), a secure digital (SD) card (SD, mini-SD, and micro-SD), a universal flash storage (UFS), a solid state drive (SSD) and the like.

SUMMARY

In an embodiment, an electronic device may include: a controller; and a non-transitory computer-readable storage medium including memory cells having a plurality of threshold voltage distributions and storing operation codes executable by the controller, wherein based on the operation codes, controller is configured to: calculate average threshold voltages of the plurality of threshold voltage distributions and set a temporary read voltage corresponding to average threshold voltages of adjacent threshold voltage distributions among the plurality of threshold voltage distributions; generate a reference value by reading read values of the memory cells with the temporary read voltage and decide a standard value corresponding to the temporary read voltage; calculate an error rate based on the reference value and the standard value and set an offset value by reflecting the error rate in a difference between the average threshold voltages of the adjacent threshold voltage distributions; and set a read voltage by applying the offset value to the temporary read voltage.

In an embodiment, a non-transitory computer-readable storage medium may include memory cells having a plurality of threshold voltage distributions and storing operation codes executable by a processing device, wherein the operation codes are codes used for performing: calculating average threshold voltages of the plurality of threshold voltage distributions and setting a temporary read voltage corresponding to average threshold voltages of adjacent threshold voltage distributions among the plurality of threshold voltage distributions; generating a reference value by reading read values of the memory cells with the temporary read voltage and determining a standard value corresponding to the temporary read voltage; calculating an error rate based on the reference value and the standard value; setting an offset value by reflecting the error rate as a difference between the average threshold voltages of the adjacent threshold voltage distributions; and setting a read voltage by applying the offset value to the temporary read voltage.

In an embodiment, an operating method for an electronic device including memory cells having a plurality of threshold voltage distributions may include: calculating average threshold voltages of the plurality of threshold voltage distributions and setting a temporary read voltage corresponding to average threshold voltages of adjacent threshold voltage distributions among the plurality of threshold voltage distributions; generating a reference value by reading read values of the memory cells with the temporary read voltage; determining a standard value corresponding to the temporary read voltage; calculating an error rate based on the reference value and the standard value; setting an offset value by reflecting the error rate as a difference between the average threshold voltages of the adjacent threshold voltage distributions; and generating a read voltage by applying the offset value to the temporary read voltage.

In an embodiment, an electronic device may include: a non-transitory computer-readable storage medium including memory cells having a plurality of threshold voltage distributions, and configured to store operation codes; and a controller configured to control the non-transitory computer-readable storage medium, by executing the operation codes read from the non-transitory computer-readable storage medium, wherein the controller comprises a read voltage setting unit configured to: calculate average threshold voltages of the plurality of threshold voltage distributions to set a temporary read voltage corresponding to average threshold voltages of adjacent threshold voltage distributions among the plurality of threshold voltage distributions; generate a reference value by reading read values of the memory cells with the temporary read voltage, and determine a standard value corresponding to the temporary read voltage; calculate an error rate based on the reference value and the standard value; set an offset value by reflecting the error rate as a difference between the average threshold voltages of the adjacent threshold voltage distributions; and set a read voltage reflecting the offset value to the temporary read voltage.

DETAILED DESCRIPTION

Figure 1:
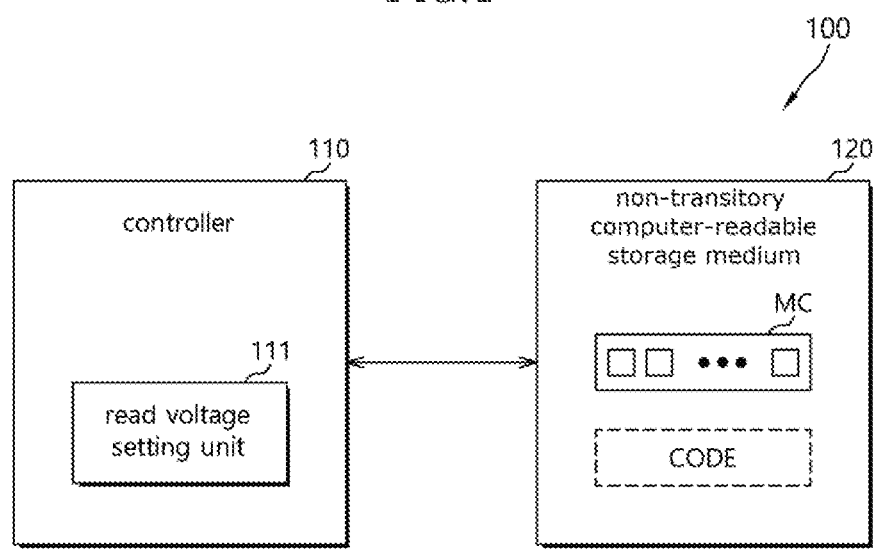
FIG. 1 is a block diagram illustrating an electronic device in accordance with an embodiment.

Hereinafter, a data storage device and an operating method thereof according to the present invention will be described with reference to the accompanying drawings through exemplary embodiments of the present invention. The present invention may, however, be embodied in different forms and should not be construed as being limited to the embodiments set forth herein. Rather, these embodiments are provided to describe the present invention in detail to the extent that a person skilled in the art to which the invention pertains can enforce the technical concepts of the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, B, and C.

The term "or" as used herein means either one of two or more alternatives but not both nor any combinations thereof.

As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element also referred to as a feature described in connection with one embodiment may be used singly or in combination with other elements of another embodiment, unless specifically indicated otherwise.

Hereinafter, the various embodiments of the present invention will be described in detail with reference to the attached drawings.

FIG. 1 is a block diagram illustrating an electronic device 100 in accordance with an embodiment.

The electronic device 100 may store data provided from an external device in response to a write request of the external device. Furthermore, the electronic device 100 may provide the stored data to the external device in response to a read request of the external device. The electronic device 100 may include a memory system.

The electronic device 100 may include a Personal Computer Memory Card International Association (PCMCIA) card, a Compact Flash (CF) card, a smart media card, a memory stick, various multimedia cards (MMC, eMMC, RS-MMC, and MMC-Micro), various secure digital cards (SD, Mini-SD, and Micro-SD), a Universal Flash Storage (UFS), a Solid State Drive (SSD) and the like.

The electronic device 100 may include a controller 110 and a non-transitory computer-readable storage medium 120.

The controller 110 may control a general operation of the electronic device 100. The controller 110 may store data in the non-transitory computer-readable storage medium 120 in response to a write request transmitted from an external device (e.g., a host), and output the data stored in the non-transitory computer-readable storage medium 120 to the external device in response to a read request transmitted from the external device.

The controller 110 may operate by executing operation codes CODE stored in the non-transitory computer-readable storage medium 120. The operation codes CODE may be used for performing: calculating average threshold voltages of a plurality of threshold voltage distributions of memory cells and setting a temporary read voltage corresponding to average threshold voltages of adjacent threshold voltage distributions among the plurality of threshold voltage distributions; generating a reference value by reading read values of the memory cells with the temporary read voltage and generating a standard value corresponding to the temporary read voltage; calculating an error rate based on the reference value and the standard value and setting an offset value by reflecting the error rate as a difference between the average threshold voltages of the adjacent threshold voltage distributions; and setting a read voltage by applying the offset value to the temporary read voltage.

In detail, the controller 110 may include a read voltage setting unit 111. The read voltage setting unit 111 may execute the operation codes CODE that are read from the non-transitory computer-readable storage medium 120. The read voltage setting unit 111 may include a memory (not illustrated) for storing the operation codes CODE. In accordance with an embodiment, a separate memory device capable of storing the operation codes CODE may be included in the controller 110 or the electronic device 100. The read voltage setting unit 111 may include a central processing device, a microprocessor, an application processor and the like.

The read voltage setting unit 111 may determine a temporary read voltage to be used when the non-transitory computer-readable storage medium 120 performs a read operation, based on the operation codes CODE. The read voltage setting unit 111 may set the temporary read voltage in the non-transitory computer-readable storage medium 120 based on the operation codes CODE. The temporary read voltage may be applied to memory cells (MCs) and then may be used in order to read data from the memory cells (MCs). The temporary read voltage may be a voltage estimated to be positioned in a valley of adjacent threshold voltage distributions among threshold voltage distributions of the memory cells (MCs).

More specifically, the read voltage setting unit 111 may calculate average threshold voltages of a plurality of threshold voltage distributions of the memory cells (MCs), respectively. The read voltage setting unit 111 may determine the temporary read voltage corresponding to the average threshold voltages of adjacent threshold voltage distributions among the plurality of threshold voltage distributions. The read voltage setting unit 111 may determine an intermediate value of the average threshold voltages of the adjacent threshold voltage distributions as the temporary read voltage.

The read voltage setting unit 111 may adjust the temporary read voltage set in the non-transitory computer-readable storage medium 120, based on the operation codes CODE. For example, when a read operation of the non-transitory computer-readable storage medium 120 based on the temporary read voltage fails, the read voltage setting unit 111 may adjust the temporary read voltage.

In detail, the read voltage setting unit 111 may determine a reference value based on read values read from the memory cells (MCs) using the temporary read voltage. The read voltage setting unit 111 may determine the number of memory cells (MCs) having a threshold voltage smaller than the temporary read voltage based on the read values, and may assign the number as the reference value.

The read voltage setting unit 111 may determine a standard value to be compared with the reference value. The standard value may be an expected value of the reference value. The read voltage setting unit 111 may use an expected value which is determined in advance according to the number of memory cells (MCs) and the number of threshold voltage distributions and incorporated in the operation codes CODE. In accordance with an embodiment, the read voltage setting unit 111 may calculate the expected value based on the number of memory cells (MCs) and the number of threshold voltage distributions.

Then, the read voltage setting unit 111 may calculate an error rate of the temporary read voltage based on the reference value and the standard value. The read voltage setting unit 111 may calculate a ratio of a difference between the standard value and the reference value with respect to the standard value as the error rate.

Subsequently, the read voltage setting unit 111 may calculate an offset value by reflecting the error rate as a difference between the average threshold voltages of the adjacent threshold voltage distributions distinguished by the temporary read voltage, and may set a read voltage by applying (e.g., adding) the offset value to the temporary read voltage.

Thus, the performance of the read operation of the non-transitory computer-readable storage medium 120 may be improved by the read voltage adjustment operation of the read voltage setting unit 111. A detailed read voltage adjustment operation of the read voltage setting unit 111 will be described in detail below.

The non-transitory computer-readable storage medium 120 may store data transmitted from the controller 110, read the stored data to transmit the read data to the controller 110, under the control of the controller 110. The non-transitory computer-readable storage medium 120 may include the memory cells (MCs) for storing data. The non-transitory computer-readable storage medium 120 may apply the temporary read voltage or the set read voltage to the memory cells (MCs) under the control of the controller 110, thereby performing the read operation.

The non-transitory computer-readable storage medium 120 may store the operation codes CODE. The operation codes CODE may be read and executed by the read voltage setting unit 111 at the time of booting or according to necessity.

The non-transitory computer-readable storage medium 120 may include a flash memory, such as a NAND flash or a NOR flash, a Ferroelectrics Random Access Memory (FeRAM), a Phase-Change Random Access Memory (PCRAM), a Magnetoresistive Random Access Memory (MRAM), a Resistive Random Access Memory (ReRAM), and the like.

FIG. 1 illustrates that the electronic device 100 includes one non-transitory computer-readable storage medium 120; however, the number of non-transitory computer-readable storage media included in the electronic device 100 is not limited thereto.

Figure 2:
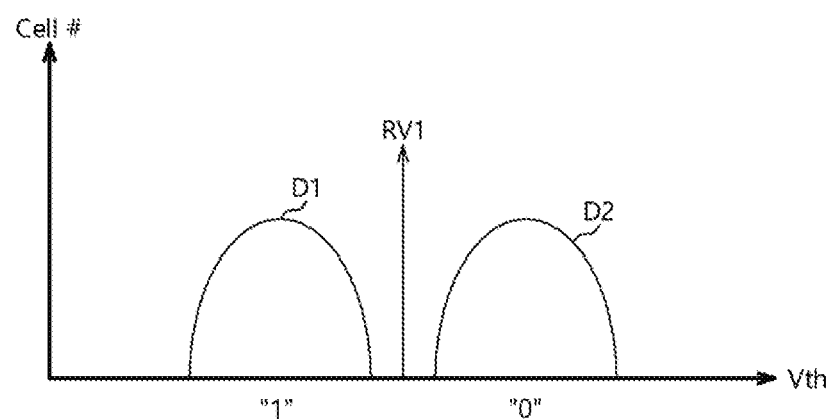
FIG. 2 is a diagram illustrating threshold voltage distributions of memory cells of FIG. 1 in accordance with an embodiment.

FIG. 2 illustrates threshold voltage distributions D1 and D2 of the memory cells (MCs) of FIG. 1 in accordance with an embodiment. A horizontal axis denotes a threshold voltage (Vth) of the memory cell and a vertical axis denotes the number (Cell #) of the memory cells (MCs) with respect to the threshold voltage.

Referring to FIG. 2, the memory cell may have a certain range of threshold voltage according to a value of data stored through a write operation. For example, when 1 bit is stored in a single memory cell, a memory cell that stores data "1" may have a threshold voltage smaller than a read voltage RV1, and a memory cell that stores data "0" may have a threshold voltage larger than the read voltage RV1. In FIG. 2, the voltage distribution D1 may correspond to memory cells that store data "1" among the memory cells (MCs) and the voltage distribution D2 may correspond to memory cells (MCs) that store data "0" among the memory cells (MCs).

When the read voltage RV1 is received, a memory cell is turned on/off according to its own threshold voltage. Thus, a read operation for the memory cell may be performed by detecting a voltage formed when the memory cell is turned on/off according to the read voltage RV1. When a memory cell having a threshold voltage smaller than the read voltage RV1 is turned on in response to the read voltage RV1, data "1" may be read. Meanwhile, when a memory cell having a threshold voltage larger than the read voltage RV1 is turned off in response to the read voltage RV1, data "0" may be read.

Accordingly, in order to distinguish the threshold voltage distributions D1 and D2 from each other, the read voltage RV1 should be positioned in a valley of the threshold voltage distributions D1 and D2 as illustrated in FIG. 2. When the read voltage RV1 is positioned in the valley of the threshold voltage distributions D1 and D2, the read voltage RV1 may be an optimal read voltage of the threshold voltage distributions D1 and D2. The optimal read voltage may be a read voltage for minimizing error bits in a read operation. If a read operation is performed based on a read voltage not positioned in the valley, read data may include uncorrectable errors and the read operation may fail. However, since it is difficult to accurately determine positions of the threshold voltage distributions D1 and D2, a precise technology may be required to set the read voltage RV1 to be positioned in the valley of the threshold voltage distributions D1 and D2.

Figure 3A:
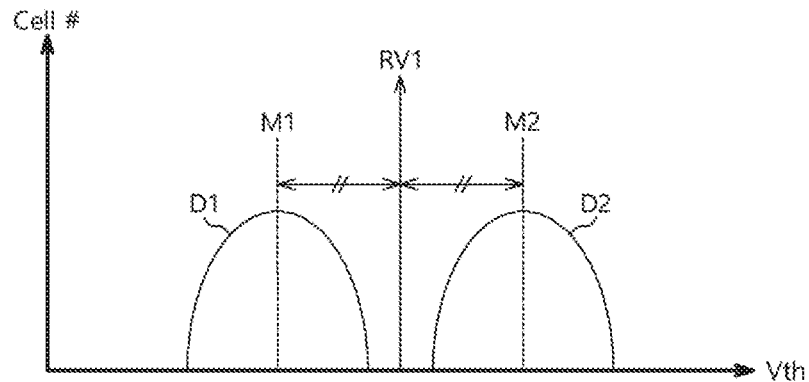
FIG. 3A to FIG. 3C are diagrams illustrating a method for determining and adjusting a read voltage in accordance with an embodiment.
Figure 3B:
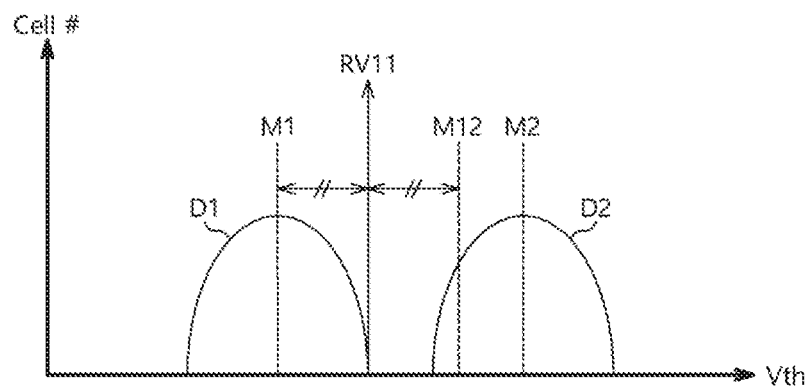
Figure 3C:
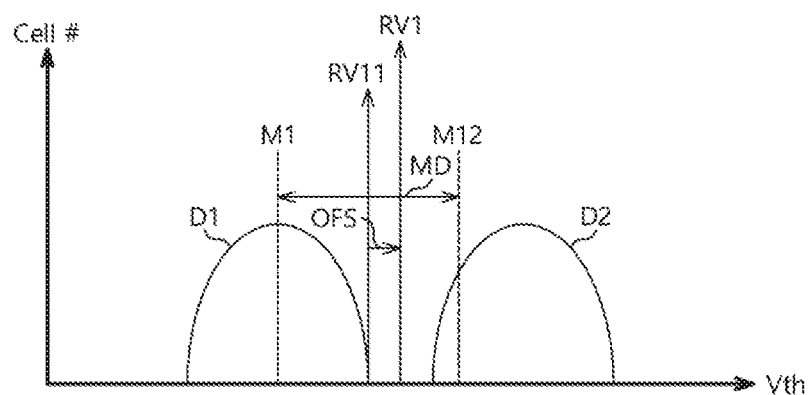

FIG. 3A to FIG. 3C are diagrams illustrating a method for determining and adjusting the read voltage RV1 in accordance with an embodiment.

Referring to FIG. 3A, in order to determine the read voltage RV1, average threshold voltages M1 and M2 of the threshold voltage distributions D1 and D2 may be calculated. As described above, since it is difficult to accurately know the positions of the threshold voltage distributions D1 and D2, the average threshold voltages M1 and M2 may be estimated. The average threshold voltages M1 and M2 may be determined according to various well-known methods. For example, the average threshold voltages M1 and M2 may be determined through a Gaussian modeling method disclosed in U.S. Pat. No. 9,741,402 issued to the within applicant.

An intermediate value of the average threshold voltages M1 and M2 may be determined as the read voltage RV1. That is, when the threshold voltage distributions D1 and D2 are distributed with substantially the same size and the average threshold voltages M1 and M2 are accurately estimated, the read voltage RV1, which is the intermediate value of the average threshold voltages M1 and M2, is accurately positioned in the valley of the threshold voltage distributions D1 and D2. The read voltage RV1 may be the temporary read voltage described above.

Referring to FIG. 3B, an average threshold voltage M12 may be erroneously estimated, instead of the average threshold voltage M2, with respect to the threshold voltage distribution D2 according to situations. In such a case, an intermediate value of the average threshold voltages M1 and M12 may be utilized as a temporary read voltage RV11. Since the temporary read voltage RV11 based on the erroneous average threshold voltage M12 is not positioned in the valley of the threshold voltage distributions D1, and D2, a read operation performed based on the temporary read voltage RV11 may fail.

Referring to FIG. 3C, the temporary read voltage RV11 may be adjusted based on a distance MD between the average threshold voltages M1 and M12 in accordance with an embodiment. The read voltage setting unit 111 may calculate an offset value OFS based on the distance MD between the average threshold voltages M1 and M12, and estimate an optimal read voltage RV1 by applying (e.g., adding) the offset value OFS to the temporary read voltage RV11. Consequently, in accordance with an embodiment, performance of a read operation may be improved.

Figure 4:
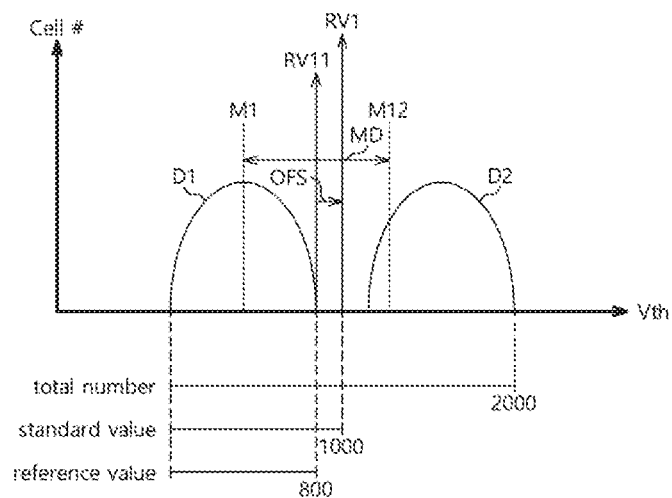
FIG. 4 is a diagram illustrating a method in which a read voltage setting unit of FIG. 1 adjusts a temporary read voltage in accordance with an embodiment.

FIG. 4 is a diagram illustrating a method in which the read voltage setting unit 111 of FIG. 1 adjusts the temporary read voltage RV11 in accordance with an embodiment.

Referring to FIG. 4, the read voltage setting unit 111 may calculate an error rate of the temporary read voltage RV11 with respect to the optimal read voltage RV1. In detail, the read voltage setting unit 111 may read read values from the memory cells (MCs) based on the temporary read voltage RV11 and determine a reference value based on the read values. The reference value may be the number of memory cells having a threshold voltage lower than the temporary read voltage RV11. Accordingly, the read voltage setting unit 111 may read the read values by applying the temporary read voltage RV11 to the memory cells (MCs), and count the number of memory cells, from which the read value is read as a predetermined value, that is, "1", to obtain the reference value.

Then, the read voltage setting unit 111 may calculate the error rate of the temporary read voltage RV11 with respect to the optimal read voltage RV1 based on the reference value and a standard value. The error rate may be calculated according to the following Equation 1.

$$\text{error rate} = (\text{standard value} - \text{reference value number per threshold voltage distribution}) \quad \text{Equation 1}$$

In Equation 1 above, the number per threshold voltage distribution may indicate a value obtained by dividing the number of all memory cells (MCs) by the number of threshold voltage distributions, that is, "2" in FIG. 4. That is, the number per threshold voltage distribution may be the number of memory cells positioned in one threshold voltage distribution when the number of memory cells positioned in the threshold voltage distribution D1 is equal to the number of memory cells positioned in the threshold voltage distribution D2.

In Equation 1 above, the standard value may be an expected value of the reference value. The standard value may indicate the number of memory cells having a threshold voltage smaller than the optimal read voltage RV1 when the number of memory cells positioned in the threshold voltage distribution D1 is equal to the number of memory cells positioned in the threshold voltage distribution D2. In other words, the standard value may indicate the number of memory cells which are turned on when the optimal read voltage RV1 is applied to the memory cells (MCs) in the case where the number of memory cells positioned in the threshold voltage distribution D1 is equal to the number of memory cells positioned in the threshold voltage distribution D2. The standard value may indicate the number of memory cells, in which a read value is read to "1", when the optimal read voltage RV1 is applied to the memory cells (MCs) in the case where the number of memory cells positioned in the threshold voltage distribution D1 is equal to the number of memory cells positioned in the threshold voltage distribution D2. The standard value may indicate a value obtained by multiplying the number of threshold voltage distributions, which is smaller than the optimal read voltage RV1, that is, "1" in FIG. 4, by the number per threshold voltage distribution.

Accordingly, when the temporary read voltage RV11 coincides with the optimal read voltage RV1, the reference value may be substantially equal to the standard value, and the error rate in Equation 1 above may be "0". Furthermore, when the temporary read voltage RV11 is smaller than the optimal read voltage RV1 as illustrated in FIG. 4, the reference value may be smaller than the standard value, and the error rate in Equation 1 above may be a positive number. However, when the temporary read voltage RV11 is larger than the optimal read voltage RV1 which is different from FIG. 4, the reference value may be larger than the standard value, and the error rate in Equation 1 above may be a negative number.

When the situation of FIG. 4 is applied to Equation 1 above, if the number of all memory cells (MCs), for example, is "2,000", the number per threshold voltage distribution may be "1,000" and the standard value of the optimal read voltage RV1 may be "1,000". In such a case, when the reference value is "800", the error rate may be 0.2.

Then, the read voltage setting unit 111 may calculate the offset value OFS by applying the error rate to the difference MD between the average threshold voltages M1 and M12 of the threshold voltage distributions D1 and D2. For example, the offset value OFS may be calculated according to Equation 2 below.

offset value OFS=(difference between average threshold voltages)×(error rate)    Equation 2

In Equation 2 above, the read voltage setting unit 111 may calculate the offset value OFS by multiplying the difference MD between the average threshold voltages M1 and M12 of the threshold voltage distributions D1 and D2 by the error rate. That is, since the temporary read voltage RV11 is the intermediate value of the average threshold voltages M1 and M12, the average threshold voltages M1 and M12 may be an appropriate standard for calculating the offset value OFS for correcting the temporary read voltage RV11.

Then, the read voltage setting unit 111 may adjust the temporary read voltage RV11 by applying the offset value OFS to the temporary read voltage RV11.

Figure 5:
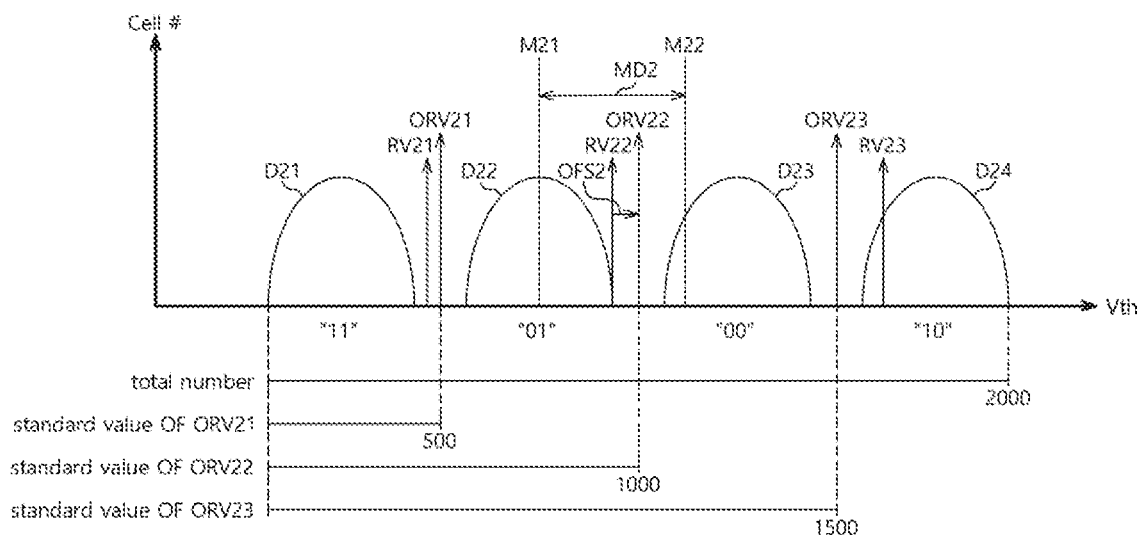
FIG. 5 is a diagram illustrating a method in which a read voltage setting unit adjusts temporary read voltages in accordance with an embodiment.

FIG. 5 is a diagram illustrating a method in which the read voltage setting unit 111 adjusts temporary read voltages RV21 to RV23 in accordance with an embodiment.

Referring to FIG. 5, as the number of bits stored in a single memory cell increases, the number of threshold voltage distributions of the memory cells (MCs) increases, so that the temporary read voltages RV21 to RV23 for a read operation may be positioned among the threshold voltage distributions. Differently from the case where 1 bit is stored in a single memory cell in FIG. 2 to FIG. 4, FIG. 5 illustrates a case where 2 bits are stored in a single memory cell and the memory cells (MCs) form four threshold voltage distributions D21 to D24. The threshold voltage distributions D21 to D24 may correspond to data "11", "01", "00", and "10", respectively. For example, a memory cell that stores data "11" may be positioned in the threshold voltage distribution D21.

Furthermore, FIG. 5 illustrates optimal read voltages ORV21 to ORV23 for the threshold voltage distributions D21 to D24. The optimal read voltages ORV21 to ORV23 may be positioned in valleys of the threshold voltage distributions, respectively.

The temporary read voltages RV21 to RV23 may be voltages estimated to be the optimal read voltages ORV21 to ORV23. In this case, respective error rates of the temporary read voltages RV21 to RV23 may be calculated based on standard values different from one another. In detail, when the number of all memory cells is "2,000", the number per threshold voltage distribution may be "500". Accordingly, the error rate of the temporary read voltage RV21 for the optimal read voltage ORV21 may be calculated by setting the standard value to "500". Furthermore, the error rate of the temporary read voltage RV22 for the optimal read voltage ORV22 may be calculated by setting the standard value to "1,000". Furthermore, the error rate of the temporary read voltage RV23 for the optimal read voltage ORV23 may be calculated by setting the standard value to "1,500".

The standard values, that is, "500", "1,000", and "1,500" may be decided in advance and included in the operation codes CODE. The read voltage setting unit 111 may select a standard value corresponding to a temporary read voltage to be adjusted from the standard values included in the operation codes CODE according to the temporary read voltage RV21, RV22, or RV23 to be adjusted, and use the selected standard value.

In accordance with an embodiment, the read voltage setting unit 111 may use, as the standard value, a value obtained by multiplying the number per threshold voltage distribution by an order of a temporary read voltage to be adjusted among the temporary read voltages RV21 to RV23. For example, when the temporary read voltage RV22 is adjusted, since the temporary read voltage RV22 is a second voltage of the temporary read voltages RV21 to RV23, the read voltage setting unit 111 may use, as the standard value, "1,000" which is obtained by multiplying the number per threshold voltage distribution by 2.

In calculating respective offset values of the temporary read voltages RV21 to RV23, average threshold voltages to be used may be average threshold voltages of threshold voltage distributions adjacent to each other that are expected to be distinguished from each other by a corresponding temporary read voltage. For example, when the temporary read voltage RV22 is adjusted, an offset value OFS2 of the temporary read voltage RV22 may be calculated by reflecting an error rate of the temporary read voltage RV22 as the difference MD2 between average threshold voltages M21 and M22 of the threshold voltage distributions D22 and D23 expected to be distinguished from each other by the temporary read voltage RV22. Since a method for adjusting the other temporary read voltages RV21 and RV23 may be performed similarly to the above, a detailed description thereof will be omitted.

Meanwhile, when i bits are stored in a single memory cell, the memory cells (MCs) may form $2^i$ threshold voltage distributions. In such a case, the number per threshold voltage distribution may be a value obtained by dividing the number of all memory cells (MCs) by $2^i$. As described above, the standard value may be a value obtained by multiplying the number of threshold voltage distributions smaller than the optimal read voltage by the number per threshold voltage distribution.

Figure 6:
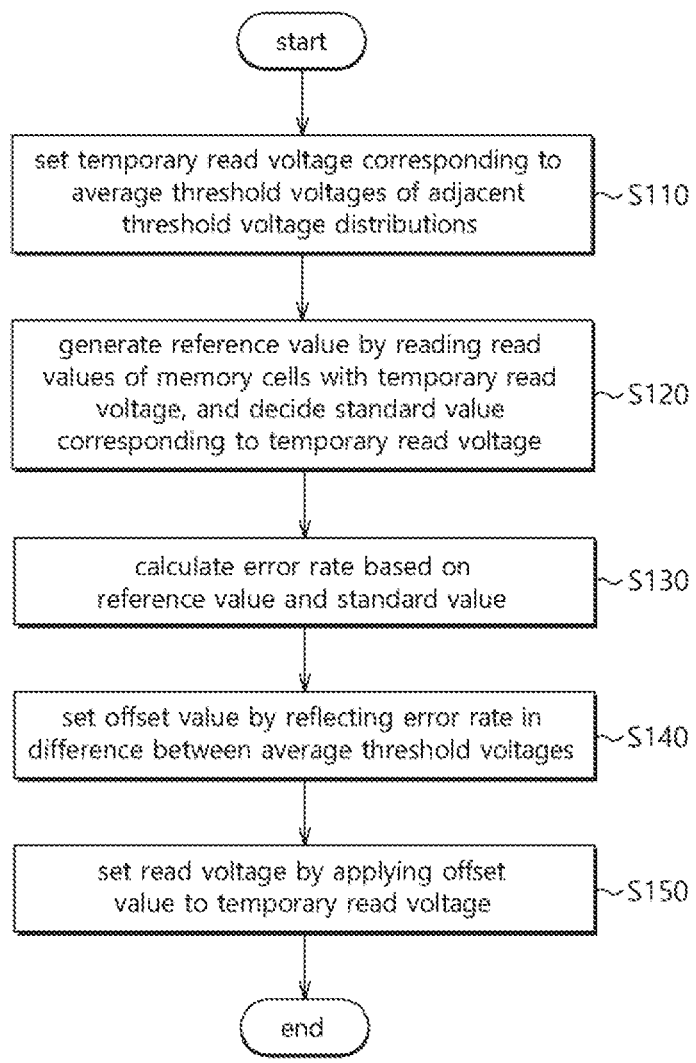
FIG. 6 is a flowchart illustrating an operation method of an electronic device of FIG. 1 in accordance with the embodiment.

FIG. 6 is a flowchart illustrating an operation method of the electronic device 100 of FIG. 1 in accordance with the embodiment. FIG. 6 illustrates a method in which the read voltage setting unit 111 of FIG. 1 adjusts a temporary read voltage.

Referring to FIG. 6, in step S110, the read voltage setting unit 111 may calculate respective average threshold voltages of a plurality of threshold voltage distributions of the memory cells (MCs), and set a temporary read voltage corresponding to average threshold voltages of adjacent threshold voltage distributions. The temporary read voltage may be an intermediate value of the average threshold voltages of the adjacent threshold voltage distributions.

In step S120, the read voltage setting unit 111 may generate a reference value by reading read values of memory cells with the temporary read voltage, and determining a standard value corresponding to the temporary read voltage. The read voltage setting unit 111 may determine the number of memory cells having a threshold voltage smaller than the temporary read voltage as the reference value. The standard value may be an expected value of the reference value.

In step S130, the read voltage setting unit 111 may calculate an error rate of the temporary read voltage based on the reference value and the standard value. The read voltage setting unit 111 may calculate a ratio of a difference between the standard value and the reference value with respect to the standard value as the error rate.

In step S140, the read voltage setting unit 111 may set an offset value by reflecting the error rate as a difference between the average threshold voltages of the adjacent threshold voltage distributions.

In step S150, the read voltage setting unit 111 may set a read voltage by applying the offset value to the temporary read voltage.

Figure 7:
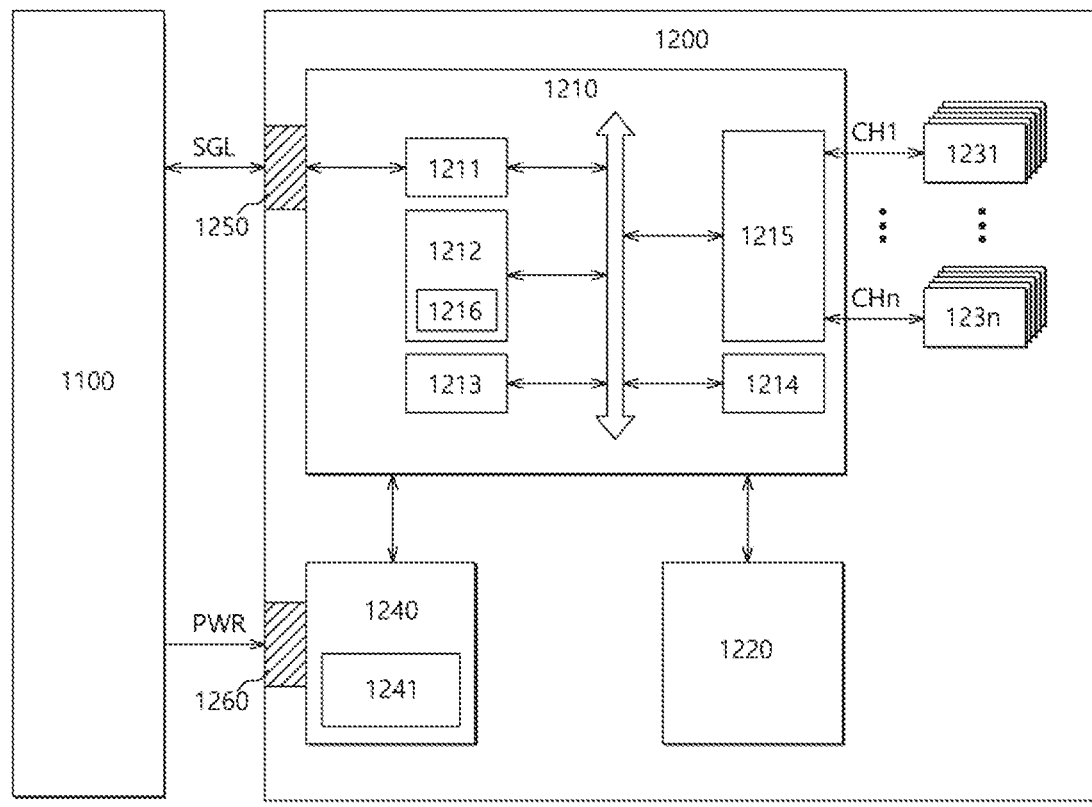
FIG. 7 is a diagram illustrating a data processing system including a solid state drive (SSD) in accordance with an embodiment.

FIG. 7 is a diagram illustrating a data processing system 1000 including a solid state drive (SSD) 1200 in accordance with an embodiment. Referring to FIG. 7, the data processing system 1000 may include a host device 1100 and the SSD 1200.

The SSD 1200 may include a controller 1210, a buffer memory device 1220, a plurality of nonvolatile memory devices 1231 to 123n, a power supply 1240, a signal connector 1250, and a power connector 1260.

The controller 1210 may control general operations of the SSD 1200. The controller 1210 may include a host interface 1211, a control circuit 1212, a random access memory 1213, an error correction code (ECC) 1214, and a memory interface 1215.

The host interface 1211 may exchange a signal SGL with the host device 1100 through the signal connector 1250. The signal SGL may include a command, an address, data, and so forth. The host interface 1211 may interface the host device 1100 and the SSD 1200 according to the protocol of the host device 1100. For example, the host interface 1211 may communicate with the host device 1100 through any one of standard interface protocols such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI express (PCI-E) and universal flash storage (UFS).

The control circuit 1212 may analyze and process the signal SGL received from the host device 1100. The control circuit 1212 may control operations of internal function blocks according to a firmware or a software for driving the SSD 1200. The random access memory 1213 may be used as a working memory for driving such a firmware or software.

The control circuit 1212 may include a read voltage setting unit 1216. The read voltage setting unit 1216 may be configured in the same manner as the read voltage setting unit 111 shown in FIG. 1.

The ECC 1214 may generate the parity data of data to be transmitted to at least one of the nonvolatile memory devices 1231 to 123n. The generated parity data may be stored together with the data in the nonvolatile memory devices 1231 to 123n. The ECC 1214 may detect an error of the data read from at least one of the nonvolatile memory devices 1231 to 123n, based on the parity data. If a detected error is within a correctable range, the ECC 1214 may correct the detected error.

The memory interface 1215 may provide control signals such as commands and addresses to at least one of the nonvolatile memory devices 1231 to 123n, according to control of the control circuit 1212. Moreover, the memory interface 1215 may exchange data with at least one of the nonvolatile memory devices 1231 to 123n, according to control of the control circuit 1212. For example, the memory interface 1215 may provide the data stored in the buffer memory device 1220, to at least one of the nonvolatile memory devices 1231 to 123n, or provide the data read from at least one of the nonvolatile memory devices 1231 to 123n, to the buffer memory device 1220.

The buffer memory device 1220 may temporarily store data in at least one of the nonvolatile memory devices 1231 to 123n. Further, the buffer memory device 1220 may temporarily store the data read from at least one of the nonvolatile memory devices 1231 to 123n. The data temporarily stored in the buffer memory device 1220 may be transmitted to the host device 1100 or at least one of the nonvolatile memory devices 1231 to 123n according to control of the controller 1210.

The nonvolatile memory devices 1231 to 123n may be used as storage media of the SSD 1200. The nonvolatile memory devices 1231 to 123n may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

The power connector 1260 may be configured by various types of connectors depending on a power supply scheme of the host device 1100.

Figure 8:
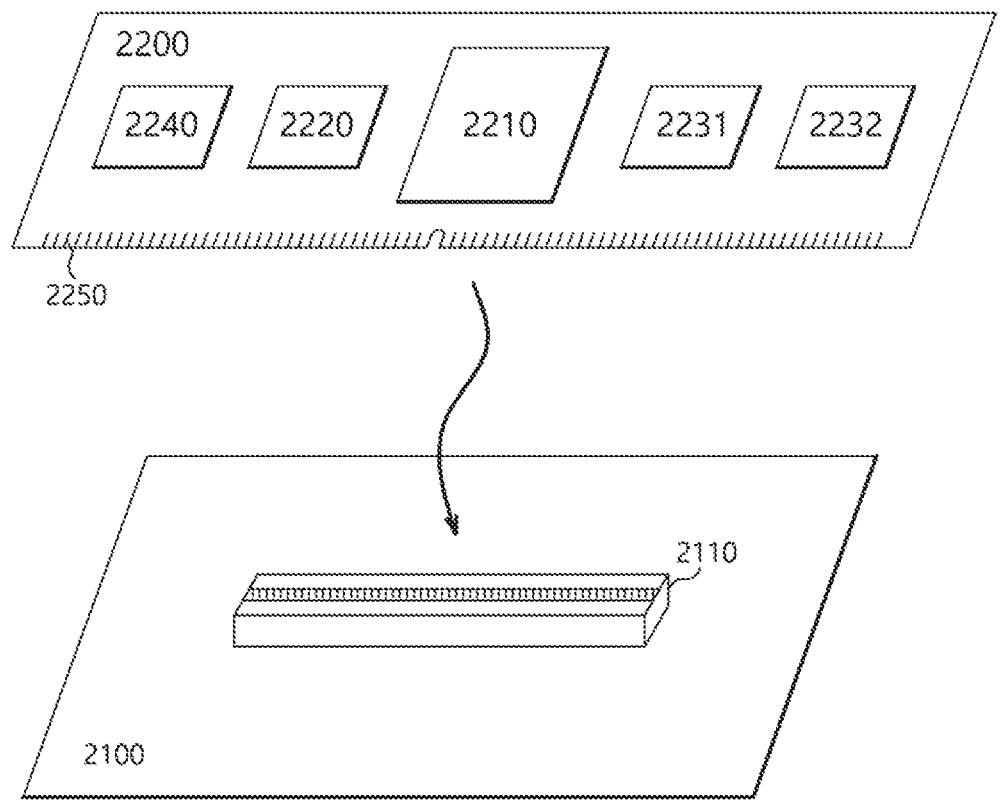
FIG. 8 is a diagram illustrating a data processing system including a memory system in accordance with an embodiment.

FIG. 8 is a diagram illustrating a data processing system 2000 including a memory system 2200 in accordance with an embodiment. Referring to FIG. 8, the data processing system 2000 may include a host device 2100 and the memory system 2200.

The host device 2100 may be configured in the form of a board such as a printed circuit board. Although not shown, the host device 2100 may include internal function blocks for performing the function of a host device.

The host device 2100 may include a connection terminal 2110 such as a socket, a slot or a connector. The memory system 2200 may be mounted to the connection terminal 2110.

The memory system 2200 may be configured in the form of a board such as a printed circuit board. The memory system 2200 may be referred to as a memory module or a memory card. The memory system 2200 may include a controller 2210, a buffer memory device 2220, nonvolatile memory devices 2231 and 2232, a power management integrated circuit (PMIC) 2240, and a connection terminal 2250.

The controller 2210 may control general operations of the memory system 2200. The controller 2210 may be configured in the same manner as the controller 1210 shown in FIG. 7.

The buffer memory device 2220 may temporarily store data in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the memory system 2200.

The PMIC 2240 may provide the power inputted through the connection terminal 2250, to the inside of the memory system 2200. The PMIC 2240 may manage the power of the memory system 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the memory system 2200. The connection terminal 2250 may be configured into various types depending on an interface scheme between the host device 2100 and the memory system 2200. The connection terminal 2250 may be disposed on any one side of the memory system 2200.

Figure 9:
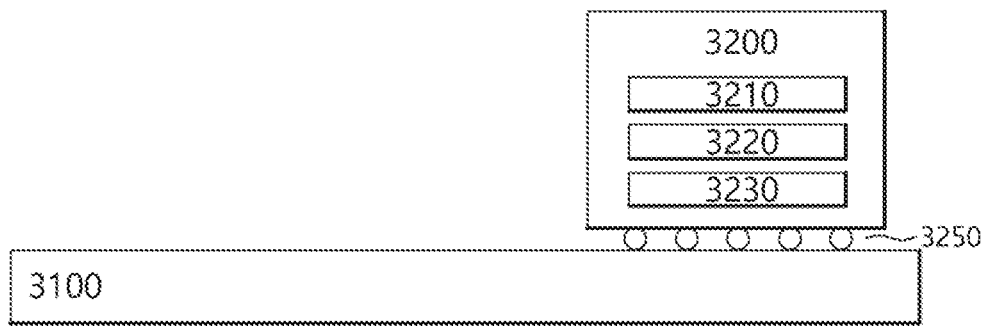
FIG. 9 is a diagram illustrating a data processing system including a memory system in accordance with an embodiment.

FIG. 9 is a diagram illustrating a data processing system 3000 including a memory system 3200 in accordance with an embodiment. Referring to FIG. 9, the data processing system 3000 may include a host device 3100 and the memory system 3200.

The host device 3100 may be configured in the form of a board such as a printed circuit board. Although not shown, the host device 3100 may include internal function blocks for performing the function of a host device.

The memory system 3200 may be configured in the form of a surface-mounting type package. The memory system 3200 may be mounted to the host device 3100 through solder balls 3250. The memory system 3200 may include a controller 3210, a buffer memory device 3220, and a nonvolatile memory device 3230.

The controller 3210 may control general operations of the memory system 3200. The controller 3210 may be configured in the same manner as the controller 1210 shown in FIG. 7.

The buffer memory device 3220 may temporarily store data in the nonvolatile memory device 3230. Further, the buffer memory device 3220 may temporarily store the data read from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the memory system 3200.

Figure 10:
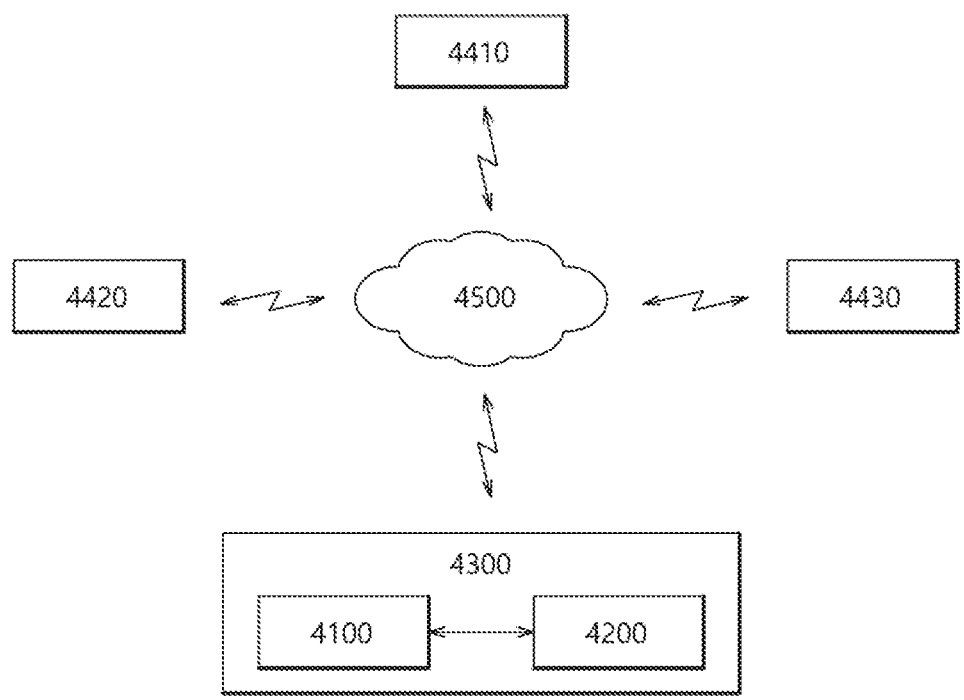
FIG. 10 is a diagram illustrating a network system including a memory system in accordance with an embodiment.

FIG. 10 is a diagram illustrating a network system 4000 including a memory system 4200 in accordance with an embodiment. Referring to FIG. 10, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and the memory system 4200. The memory system 4200 may be configured by the electronic device 100 shown in FIG. 1, the memory system 1200 shown in FIG. 7, the memory system 2200 shown in FIG. 8 or the memory system 3200 shown in FIG. 9.

Figure 11:
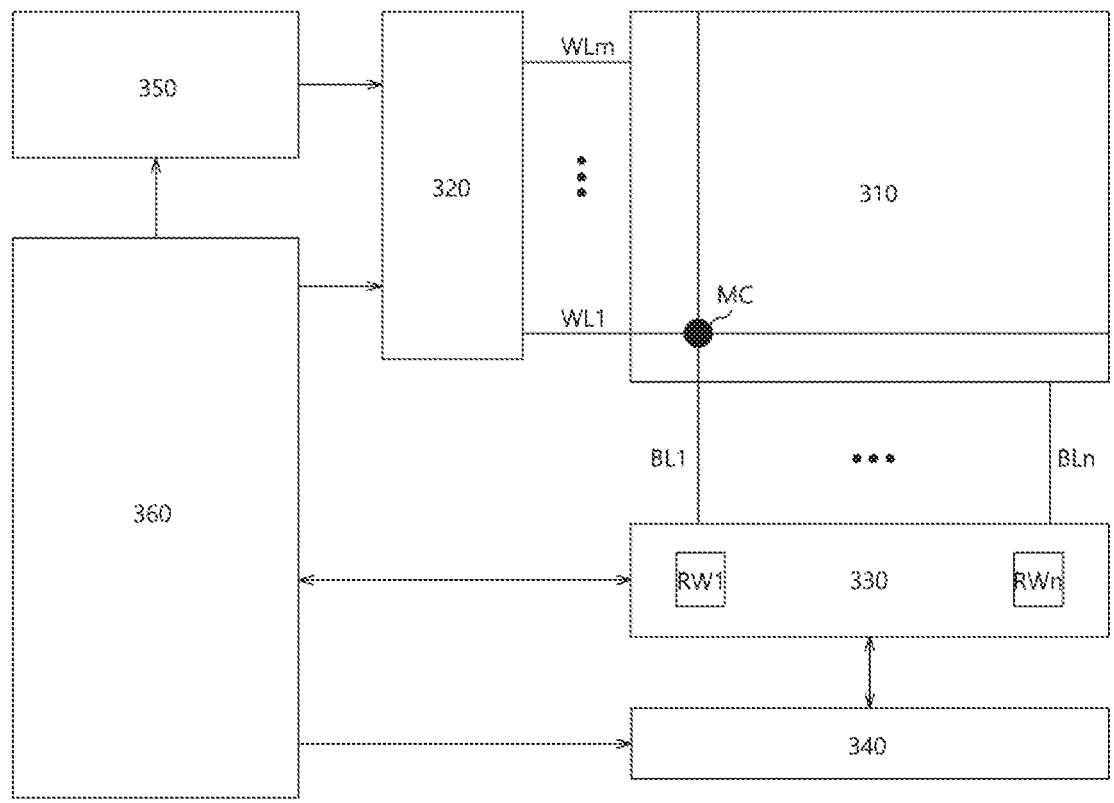
FIG. 11 is a block diagram illustrating a nonvolatile memory device included in a memory system in accordance with an embodiment.

FIG. 11 is a block diagram illustrating a nonvolatile memory device 300 included in a memory system in accordance with an embodiment. Referring to FIG. 11, the nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control operations of the nonvolatile memory device 300 such as read, write and erase operations of the nonvolatile memory device 300.

While various embodiments have been described above, it will be understood to those skilled in the art that the embodiments described are examples only. Accordingly, the electronic device, the non-transitory computer-readable storage medium, and the method of controlling the electronic device described herein should not be limited based on the described embodiments.

What is claimed is:
1. An electronic device comprising:
a controller; and a non-transitory computer-readable storage medium including memory cells having a plurality of threshold voltage distributions and storing operation codes executable by the controller, wherein based on the operation codes, controller is configured to:

calculate average threshold voltages of the plurality of threshold voltage distributions and set a temporary read voltage corresponding to average threshold voltages of adjacent threshold voltage distributions among the plurality of threshold voltage distributions;

read read values from the memory cells by applying the temporary read voltage to the memory cells, count a number of memory cells each of which a read value is a predetermined value, as a reference value, and decide a standard value corresponding to the temporary read voltage;

calculate an error rate based on the reference value and the standard value and set an offset value by reflecting the error rate in a difference between the average threshold voltages of the adjacent threshold voltage distributions; and set a read voltage by applying the offset value to the temporary read voltage.

2. The electronic device according to claim 1, wherein the reference value is determined by a number of memory cells having a threshold voltage lower than the temporary read voltage among the memory cells.

3. The electronic device according to claim 1, wherein the standard value is an expected value of the reference value, which is incorporated in the operation codes.

4. The electronic device according to claim 1, wherein the error rate is calculated as a ratio of a difference between the standard value and the reference value with respect to the standard value.

5. The electronic device according to claim 1, wherein the offset value is calculated by multiplying the difference between the average threshold voltages of the adjacent threshold voltage distributions by the error rate.

6. The electronic device according to claim 1, wherein the temporary read voltage is set as an intermediate value of the average threshold voltages of the adjacent threshold voltage distributions.

7. The electronic device according to claim 1, wherein the read voltage is generated by adding the offset value to the temporary read voltage.

8. A non-transitory computer-readable storage medium comprising:

memory cells having a plurality of threshold voltage distributions and storing operation codes executable by a processing device, wherein the operation codes are codes used for performing:

calculating average threshold voltages of the plurality of threshold voltage distributions and setting a temporary read voltage corresponding to average threshold voltages of adjacent threshold voltage distributions among the plurality of threshold voltage distributions;

reading read values from the memory cells by applying the temporary read voltage to the memory cells, counting a number of memory cells each of which a read value is a predetermined value, as a reference value, and determining a standard value corresponding to the temporary read voltage;

calculating an error rate based on the reference value and the standard value;

setting an offset value by reflecting the error rate as a difference between the average threshold voltages of the adjacent threshold voltage distributions; and setting a read voltage by applying the offset value to the temporary read voltage.

9. The non-transitory computer-readable storage medium according to claim 8, wherein the reference value is determined by a number of memory cells having a threshold voltage lower than the temporary read voltage among the memory cells.

10. The non-transitory computer-readable storage medium according to claim 8, wherein the standard value is an expected value of the reference value, which is incorporated in the operation codes.

11. The non-transitory computer-readable storage medium according to claim 8, wherein the error rate is calculated as a ratio of a difference between the standard value and the reference value with respect to the standard value.

12. The non-transitory computer-readable storage medium according to claim 8, wherein the offset value is calculated by multiplying the difference between the average threshold voltages of the adjacent threshold voltage distributions by the error rate.

13. The non-transitory computer-readable storage medium according to claim 8, wherein the temporary read voltage is set as an intermediate value of the average threshold voltages of the adjacent threshold voltage distributions.

14. An operating method for an electronic device including memory cells having a plurality of threshold voltage distributions, the operating method comprising:

calculating average threshold voltages of the plurality of threshold voltage distributions and setting a temporary read voltage corresponding to average threshold voltages of adjacent threshold voltage distributions among the plurality of threshold voltage distributions;

reading read values from the memory cells by applying the temporary read voltage to the memory cells;

counting a number of memory cells each of which a read value is a predetermined value, as a reference value;

determining a standard value corresponding to the temporary read voltage;

calculating an error rate based on the reference value and the standard value;

setting an offset value by reflecting the error rate as a difference between the average threshold voltages of the adjacent threshold voltage distributions; and generating a read voltage by applying the offset value to the temporary read voltage.

15. The method according to claim 14, wherein the generating of the reference value comprises:

counting memory cells having a threshold voltage lower than the temporary read voltage among the memory cells; and setting a value of the counted memory cells as the reference value.

16. The method according to claim 14, wherein the determining of the standard value comprises:

calculating an expected value of the generated reference value as the standard value.

17. The method according to claim 14, wherein the calculating the error rate comprises:

calculating a difference between the standard value and the reference value; and calculating a ratio of the difference with respect to the standard value as the error rate.

18. The method according to claim 14, wherein the setting of the offset value comprises:
   calculating the offset value by multiplying the difference between the average threshold voltages of the adjacent threshold voltage distributions by the error rate.

19. The method according to claim 14, wherein the setting of the temporary read voltage comprises:
   calculating the difference between the average threshold voltages of the adjacent threshold voltage distributions; and
   reflecting the difference in the average threshold voltages of the adjacent threshold voltage distributions and setting an intermediate value of the average threshold voltages as the temporary read voltage.

20. The method according to claim 14, wherein the generating of the read voltage comprises:
   calculating the read voltage by adding the offset value to the temporary read voltage.

* * * * *